(12) United States Patent
Nakayama

(10) Patent No.: US 11,943,871 B2
(45) Date of Patent: Mar. 26, 2024

(54) COMPONENT MOUNTER

(71) Applicant: FUJI CORPORATION, Chiryu (JP)

(72) Inventor: Yukinori Nakayama, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 191 days.

(21) Appl. No.: 17/430,359

(22) PCT Filed: Feb. 14, 2019

(86) PCT No.: PCT/JP2019/005273
§ 371 (c)(1),
(2) Date: Aug. 12, 2021

(87) PCT Pub. No.: WO2020/165993
PCT Pub. Date: Aug. 20, 2020

(65) Prior Publication Data
US 2022/0132712 A1 Apr. 28, 2022

(51) Int. Cl.
*H05K 13/00* (2006.01)
*H05K 13/04* (2006.01)
(52) U.S. Cl.
CPC ....... *H05K 13/0409* (2018.08); *H05K 13/041* (2018.08); *H05K 13/0413* (2013.01)
(58) Field of Classification Search
CPC ............ H05K 13/0409; H05K 13/041; H05K 13/0413; H05K 13/043
See application file for complete search history.

(56) References Cited

U.S. PATENT DOCUMENTS

| 8,196,294 B2* | 6/2012 | Kino ................. H05K 13/0434 |
| | | 226/110 |
| 9,974,219 B2* | 5/2018 | Ishitani ............... H05K 13/021 |
| 10,555,450 B2* | 2/2020 | Iisaka .................... H05K 13/08 |
| 11,357,146 B2* | 6/2022 | Mizutani ............. H05K 13/041 |
| 2017/0325369 A1 | 11/2017 | Iisaka et al. |
| 2022/0264777 A1* | 8/2022 | Kawajiri ............... H05K 1/183 |

FOREIGN PATENT DOCUMENTS

| JP | 3-227595 A | 10/1991 |
| JP | 11-121985 A | 4/1999 |
| JP | WO 2016/072014 A1 | 5/2016 |

OTHER PUBLICATIONS

International Search Report dated May 7, 2019 in PCT/JP2019/005273 filed on Feb. 14, 2019 (1 page).

* cited by examiner

*Primary Examiner* — Paul D Kim
(74) *Attorney, Agent, or Firm* — Oblon, McClelland, Maier & Neustadt, L.L.P.

(57) ABSTRACT

A component mounter for mounting electronic components includes a mounting head with at least two suction nozzles in the multiple suction nozzles are lowered simultaneously so as to pick up at least two electronic components simultaneously. A control device, which is configured to control electronic component pickup and mounting operations, causes the mounting head to move so as to position the at least two suction nozzles that are lowered simultaneously in an electronic component pickup operation step to be located individually on at least two trays on the pallet, causes the at least two suction nozzles to be lowered simultaneously, and causes electronic components on the at least two trays to be picked up simultaneously.

9 Claims, 10 Drawing Sheets

(PROCEED TO STEP 114 SHOWN IN Fig. 10)

COMPONENT MOUNTER

TECHNICAL FIELD

The present description discloses a technique related to a component mounter for mounting electronic components arranged on multiple trays that are placed on a pallet of a tray-type component supply device (tray feeder) on a circuit board by picking up the electronic components with multiple suction nozzles that are provided on a mounting head in such a manner as to be lifted up and lowered.

BACKGROUND ART

In general, in a tray-type component supply device, as described in Patent Literature 1 (JP-A-11-121985), multiple pallets, on each of which a tray having a predetermined number of electronic components arranged thereon is placed, are individually housed in multiple slots that are provided in stages in a magazine in a one-to-one fashion, this magazine is moved up or down so that a desired pallet is pulled out from the magazine, and the electronic components arranged on the tray on the pallet so pulled out are picked up by a suction nozzle of a component mounter so as to be mounted on a circuit board.

Further, in recent years, in component mounters including a rotary-type mounting head, as described in Patent Literature 2 (International Publication No. WO2016/072014), there is provided a component mounter in which a Z-axis driving mechanism for lowering a suction nozzle is provided at two locations on a circumference of a mounting head so as to lower two suction nozzles in multiple suction nozzles that are held by the mounting head simultaneously, and when picking up electronic components on a tray, two suction nozzles are lowered simultaneously so as to pick up two electronic components on the tray simultaneously.

PATENT LITERATURE

Patent Literature 1: JP-A-11-121985
Patent Literature 2: International Publication No. WO2016/072014

BRIEF SUMMARY

Technical Problem

Incidentally, when two suction nozzles are simultaneously lowered to pick up two electronic components on a tray simultaneously, the two suction nozzles, which are lowered simultaneously, need to be spaced apart at the same interval as an interval (a component arrangement pitch) at which the two electronic components, which are picked up simultaneously, are spaced apart. Since sizes of electronic components differ type by type, with a certain type of electronic components, there may be a case in which an interval at which two components are spaced apart on a tray does not match the interval at which the two suction nozzles, which are lowered simultaneously, are spaced apart. In this case, the two electronic components on the tray cannot be picked up simultaneously, and hence, the production cycle cannot be improved.

In addition, in Patent Literatures 1 and 2 described above, although only one tray is placed on the pallet, there is a component mounter in which multiple trays are placed on a pallet. In a case that multiple trays are placed on one pallet, the size of one tray becomes smaller than a case in which one tray is placed on one pallet, and the size of electronic components that are arranged on such a tray is smaller accordingly. On the other hand, since the interval at which the two suction nozzles, which are lowered simultaneously, are spaced apart remains the same even when the size of electronic components is so smaller, in a case that two electronic components are attempted to be picked up simultaneously on one tray as conventionally done, the number of electronic components that cannot be picked up simultaneously is increased. That is, when the size of the electronic components on the tray is reduced, which then reduces an interval (a component arrangement pitch) at which the electronic components are spaced apart on the tray, the number of electronic components that are positioned inside the interval at which the two suction nozzles, which are lowered simultaneously, are spaced apart to thereby be unable to be picked up simultaneously (the number of electronic components that are picked up one by one) is increased, whereby the effect of improving the production cycle is reduced.

Solution to Problem

In order to solve the problems described above, there is provided a component mounter for mounting electronic components arranged on a tray placed on a pallet of a tray-type component supply device on a circuit board by picking up the electronic components with multiple suction nozzles provided on a mounting head in such a manner as to be lifted up and lowered, wherein multiple trays are placed to be aligned on the pallet, wherein the mounting head is configured such that at least two suction nozzles in the multiple suction nozzles are lowered simultaneously so as to pick up at least two electronic components simultaneously, and wherein a control device configured to control electronic component pickup and mounting operations causes the mounting head to move so as to position the at least two suction nozzles that are lowered simultaneously in an electronic component pickup operation step to be located individually on at least two trays on the pallet, causes the at least two suction nozzles to be lowered simultaneously, and causes electronic components on the at least two trays to be picked up simultaneously.

As described above, in a case that multiple trays are placed on one pallet, the size of one tray is smaller than a case in which one tray is placed on one pallet, and the size of electronic components that are arranged on such a tray is smaller accordingly; however, the interval at which the multiple suction nozzles that are lowered simultaneously remains the same. Even in this case, by causing the mounting head to move so as to position the at least two suction nozzles, which are lowered simultaneously, to be located individually on the at least two trays on the pallet and causing the at least two suction nozzles to simultaneously pick up electronic components on the at least two trays, electronic components on the multiple trays on the pallet can be picked up with good efficiency, thereby making it possible to improve the production cycle.

In this case, electronic components remaining in positions where they cannot be picked up simultaneously on the individual trays on the pallet may be picked up one by one, or in a case that the electronic components so remaining on the trays can be picked up simultaneously by rotating reversely the individual trays on the pallet through 180° so as to so change their directions, the remaining electronic components may be picked up simultaneously by rotating reversely the individual trays trough 180° so as to so change their directions. Further, the positions of the trays on the pallet may be made adjustable in accordance with the interval at which the suction nozzles, which are lowered simultaneously, are spaced apart.

DESCRIPTION OF EMBODIMENTS

Figure 1:
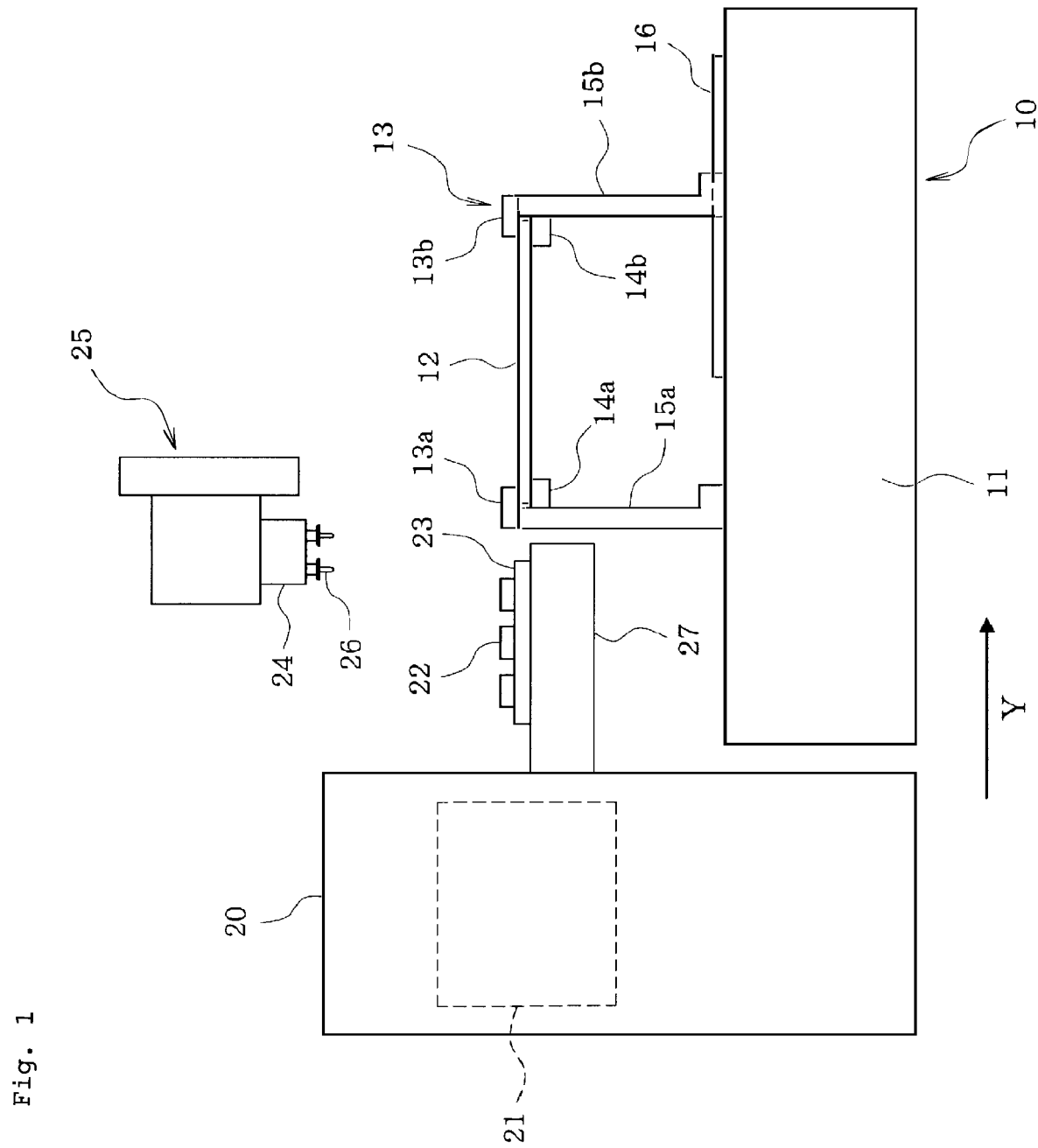
FIG. 1 is a side view schematically showing the configuration of a component mounter according to an embodiment.

Hereinafter, one embodiment disclosed in the present description will be described by use of drawings. First, the configuration of component mounter 10 will be described based on FIGS. 1 to 7.

A conveyor 13 for conveying circuit board 12 is provided on base platform 11 of component mounter 10 (hereinafter, a conveyance direction of circuit board 12 by conveyor 13 is referred to as an X-direction). Of support members 15a, 15b that support two conveyor rails 13a, 13b and two conveyor belts 14a, 14b that constitute this conveyor 13, first support member 15a is fixed to a certain position, while a position of second support member 15b, which is located in an opposite position to first support member 15a, in a Y-direction (a position in a direction perpendicular to the X-direction) is made to be adjusted along guide rail 16 by a feeding screw mechanism (not shown) or the like, whereby the width of conveyor 13 (an interval between conveyor rails 13a, 13b) can be adjusted so as to match the width of circuit board 12.

Tray-type component supply device 20 (tray feeder) is set to a side of conveyor 13. Magazine 21, which is configured to be lifted up and lowered by a lifting and lowering mechanism (not shown), is provided in an interior portion of tray-type component supply device 20, and pallet 23 loaded with one or multiple trays 22 is housed in each of multiple slots provided in this magazine 21 in a stacked fashion.

Pallet pull-out table 27, which is configured to move pallet 23 (tray 22) that is pulled out from magazine 21 by a pallet pull-out mechanism (not shown) to a component suction station of component mounter 10, is provided on a back side (a side facing conveyor 13) of tray-type component supply device 20.

Head moving mechanism 25 is provided on component mounter 10 so as to move mounting head 24 in XY-directions between the component suction station (above pallet pull-out table 27) where a component suction or pickup operation is performed and a component mounting station (above conveyor 13) where a component mounting operation is performed. Multiple suction nozzles 26 are held to rotary head section 29 of mounting head 24 at predetermined intervals (pitches) in a circumferential direction so as to pick up electronic component 30 (refer to FIGS. 4 to 6) arranged on tray 22 on pallet 23 that is pulled out on to pallet pull-out table 27 of tray-type component supply device 20.

Figure 2:
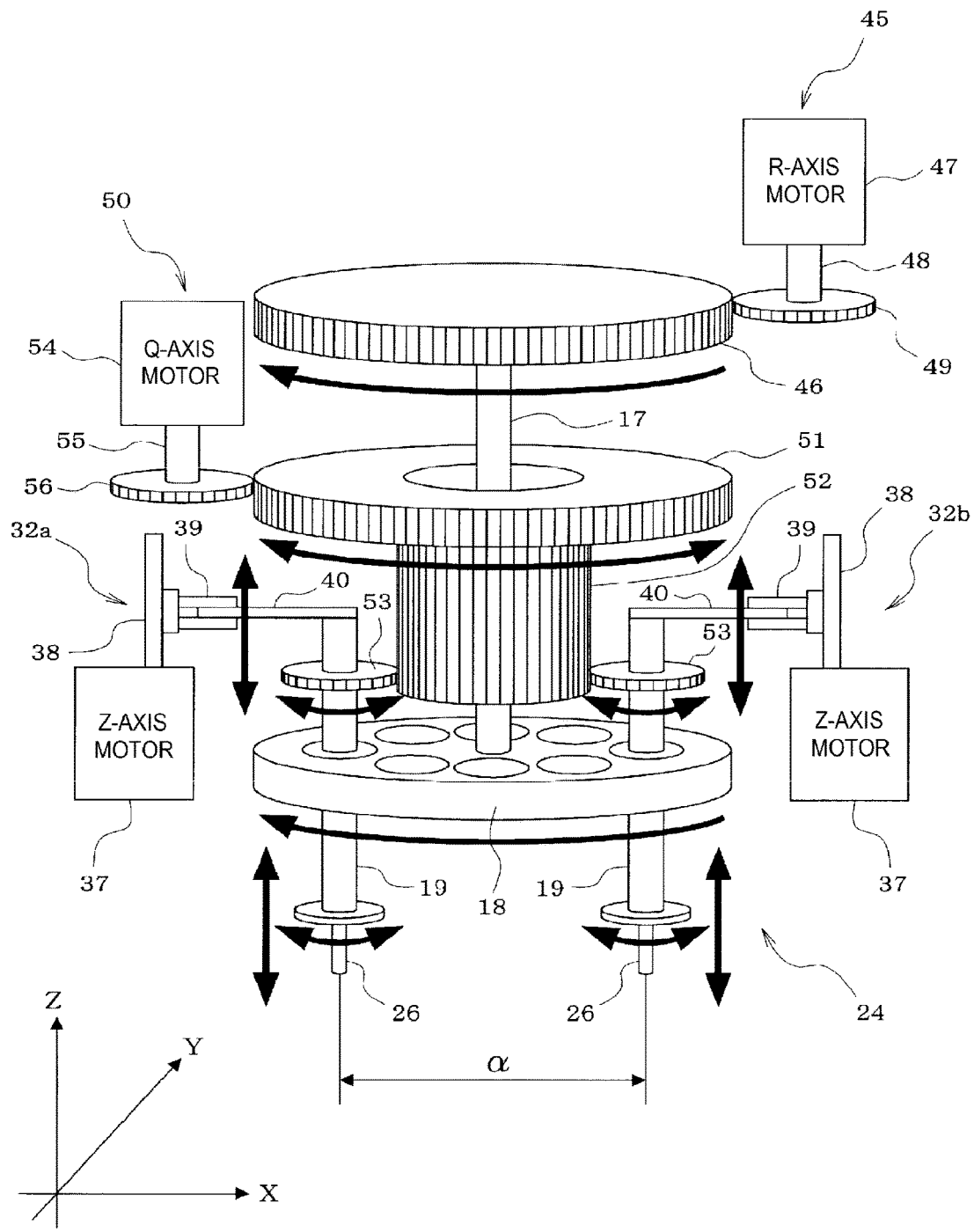
FIG. 2 is a perspective view showing the configuration of a mounting head.

As shown in FIG. 2, mounting head 24 includes rotary head section 18 securely fitted on a lower end of R shaft 17 extending in an up-down direction, multiple nozzle holders 19 that are held to an outer circumferential portion of rotary head section 18 at predetermined pitches, and multiple suction nozzles 26 held to those multiple nozzle holders 19 in such a manner as to be exchanged as required. R-axis gear 46 of R-axis driving mechanism 45 (a head rotating mechanism) is securely fitted on an upper end of R-shaft 17, and gear 49, which is fixed to rotary shaft 48 of R-axis motor 47, meshes with this R-axis gear 46, so that R-axis gear 46 rotates as a result of rotation of gear 49 of R-axis motor 47 to thereby cause rotary head section 18 to rotate about R-shaft 17, whereby multiple nozzle holders 19 are caused to revolve in a circumferential direction of rotary head section 18 together with multiple suction nozzles 26.

Upper and lower two Q-axis gears 51, 52 of Q-axis driving mechanism 50 (a nozzle rotating mechanism) are rotatably passed over R-shaft 17, and gear 53 securely fitted on an upper end of each nozzle holder 19 meshes with lower Q-axis gear 52. Gear 56 fixed to rotary shaft 55 of Q-axis motor 54 meshes with upper Q-axis gear 51, so that Q-axis gears 51, 52 integrally rotate as a result of rotation of gear 56 of Q-axis motor 54 to thereby cause individual gears 53 to rotate, whereby individual nozzle holders 19 are caused to rotate about axes of those individual nozzle holders 19, thereby allowing for correction of the directions (angles) of electronic components 30 that are picked up by suction nozzles 26 held to those individual nozzle holders 19.

Figure 3:
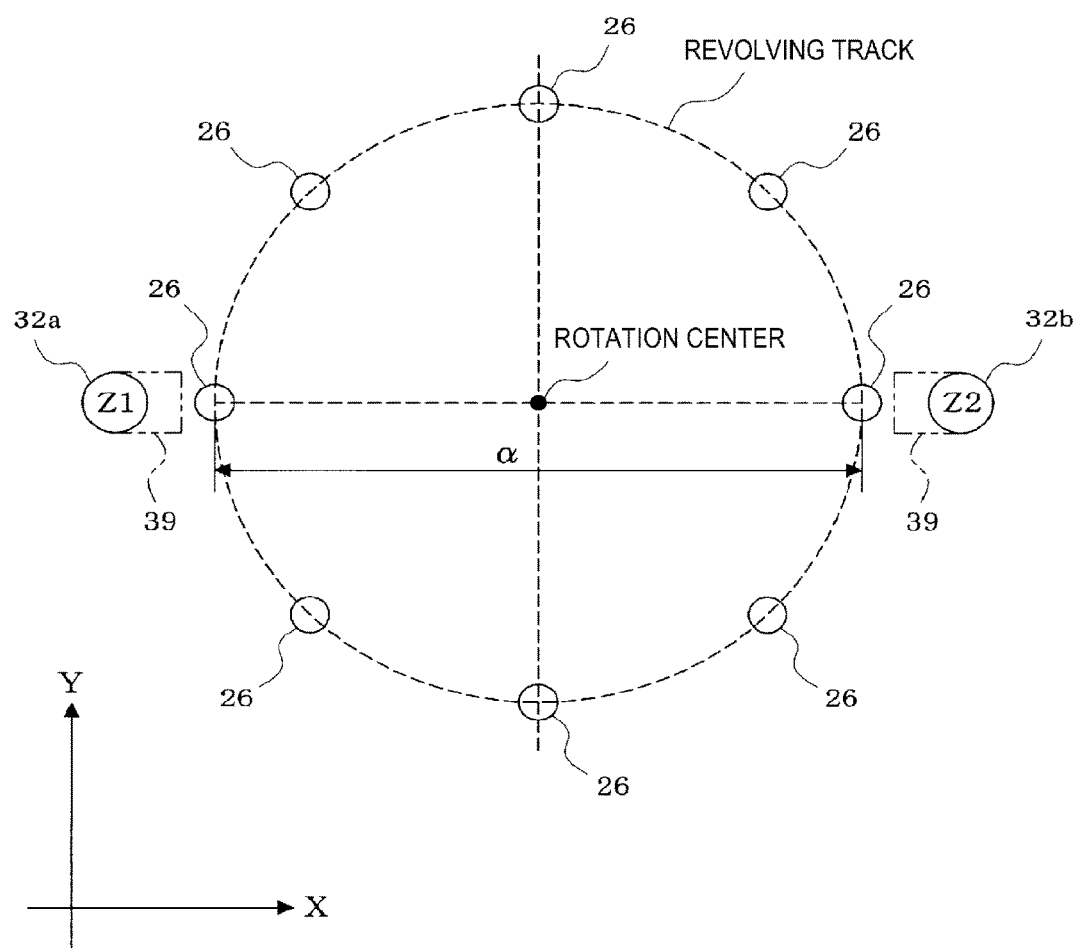
FIG. 3 is a plan view describing a positional relationship between suction nozzles (nozzle holders), and a Z1-axis driving mechanism and a Z2-axis driving mechanism.

Further, multiple Z-axis driving mechanisms 32a, 32b are provided which are configured to cause suction nozzles 26 to be lowered in stop positions at multiple locations on a revolving track of suction nozzles 26 so that suction nozzles 26 so lowered can pick up electronic components 30 on tray 22. In the present embodiment, as shown in FIGS. 2 and 3, Z1-axis driving mechanism 32a and Z2-axis driving mechanism 32b are provided at two locations on a circumference of rotary head section 18, so that two suction nozzles 26 are simultaneously lowered to be positioned individually on two different trays 22 by Z1-axis driving mechanism 32a and Z2-axis driving mechanism 32b so as to allow two suction nozzles 26 so lowered to pick up electronic components 30 on those two trays 22. The number of suction nozzles 26 that are to be held on to mounting head 24 is an integral multiple of the number of suction nozzles 26 that are to be lowered simultaneously (two in the present embodiment).

The positions of Z1-axis driving mechanism 32a and Z2-axis driving mechanism 32b are, for example, positions of 0° and 180° or positions of 90° and 270° when expressed by rotation angles of rotary head section 18. Here, 0° and 180° denote an X-direction (a board conveyance direction) and an opposite direction thereto, whereas 90° and 270° denote a Y-direction (a direction perpendicular to the board conveyance direction) and an opposite direction thereto. In addition, the positions of Z1-shaft driving mechanism 32a and Z2-shaft driving mechanism 32b may be any of positions of 0°+θ°, 0°−θ°, positions of 90°+θ° and 90°−θ°, positions of 180°+θ° and 180°−θ°, and 270°+θ° and 270°−θ°. However, θ° is an angle of one pitch or an integral multiple thereof of the nozzle pitch. In short, a positional relationship only needs to be provided in which a straight line connecting two suction nozzles 26 that are lowered simultaneously is parallel to an X-axis or a Y-axis.

Each of Z1-axis and Z2-axis driving mechanisms 32a, 32b uses Z-axis motor 37 as an actuator and causes Z-axis motor 37 to rotate feeding screw 38 so as to move Z-axis slide 39 in the up-down direction, whereby Z-axis slide 39 so moved is brought into engagement with engagement piece 40 provided at an upper end of nozzle holder 19 of rotary head section 18 to move that nozzle holder 19 in the up-down direction, thereby causing suction nozzle 26 held at a lower section of nozzle holder 19 in question to move in the up-down direction. Z-axis slides 39 of Z1-axis and Z2-axis driving mechanisms 32a, 32b are held so as to move only in a Z-direction while being prevented from moving in the XY-directions, so that positions of Z-axis slides 39 in the XY-directions are made to stay unchanged, causing Z-axis slides 39 to stay in certain positions even though rotary head section 18 operates rotationally. A linear motor may be used as Z-axis motor 37 to move Z-axis slide 39 in the up-down direction. Alternatively, a linear solenoid, an air cylinder, or the like may be used in place of the linear motor.

Pallet 23 of tray-type component supply device 20 is configured such that the position of at least one of two adjacent trays 22 is adjusted so as to cause an interval defined between two electronic components 30 that are located individually on those two adjacent trays 22 and are to be picked up simultaneously to become the same as interval α defined between two suction nozzles 26 that are lowered simultaneously.

Figure 4:
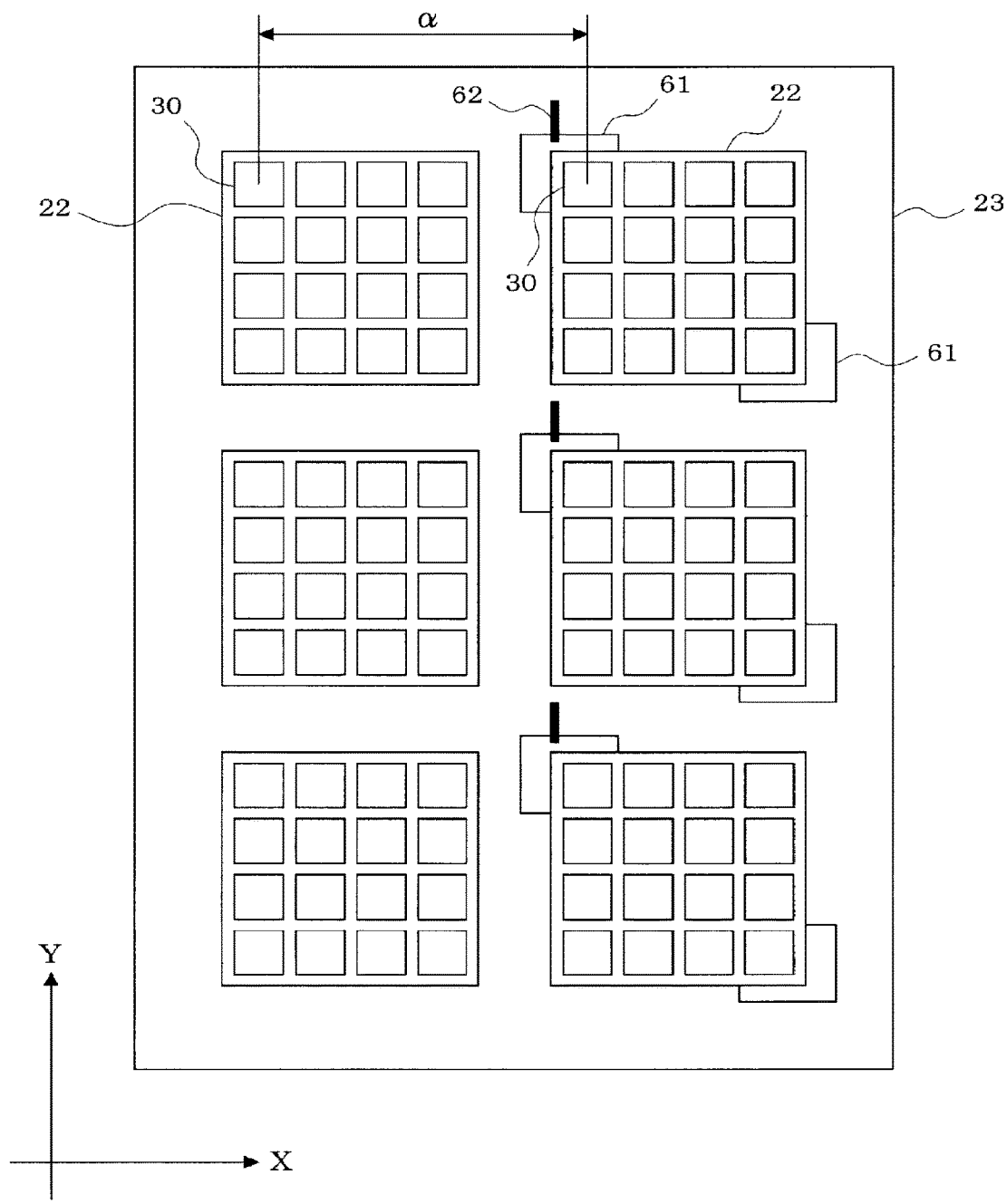
FIG. 4 is a plan view showing a first example of an arrangement of trays on a pallet.
Figure 5:
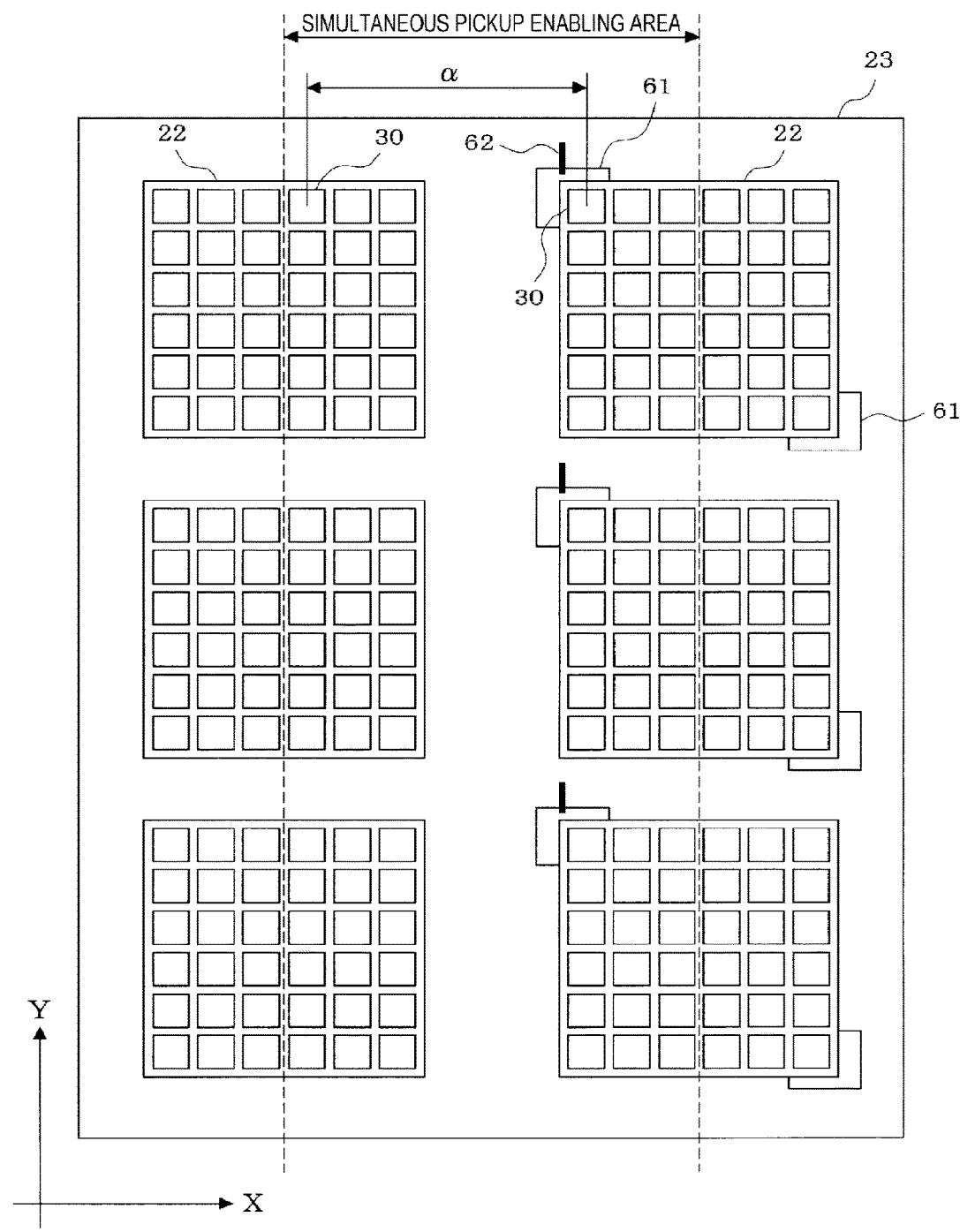
FIG. 5 is a plan view showing a second example of an arrangement of trays on a pallet.
Figure 6:
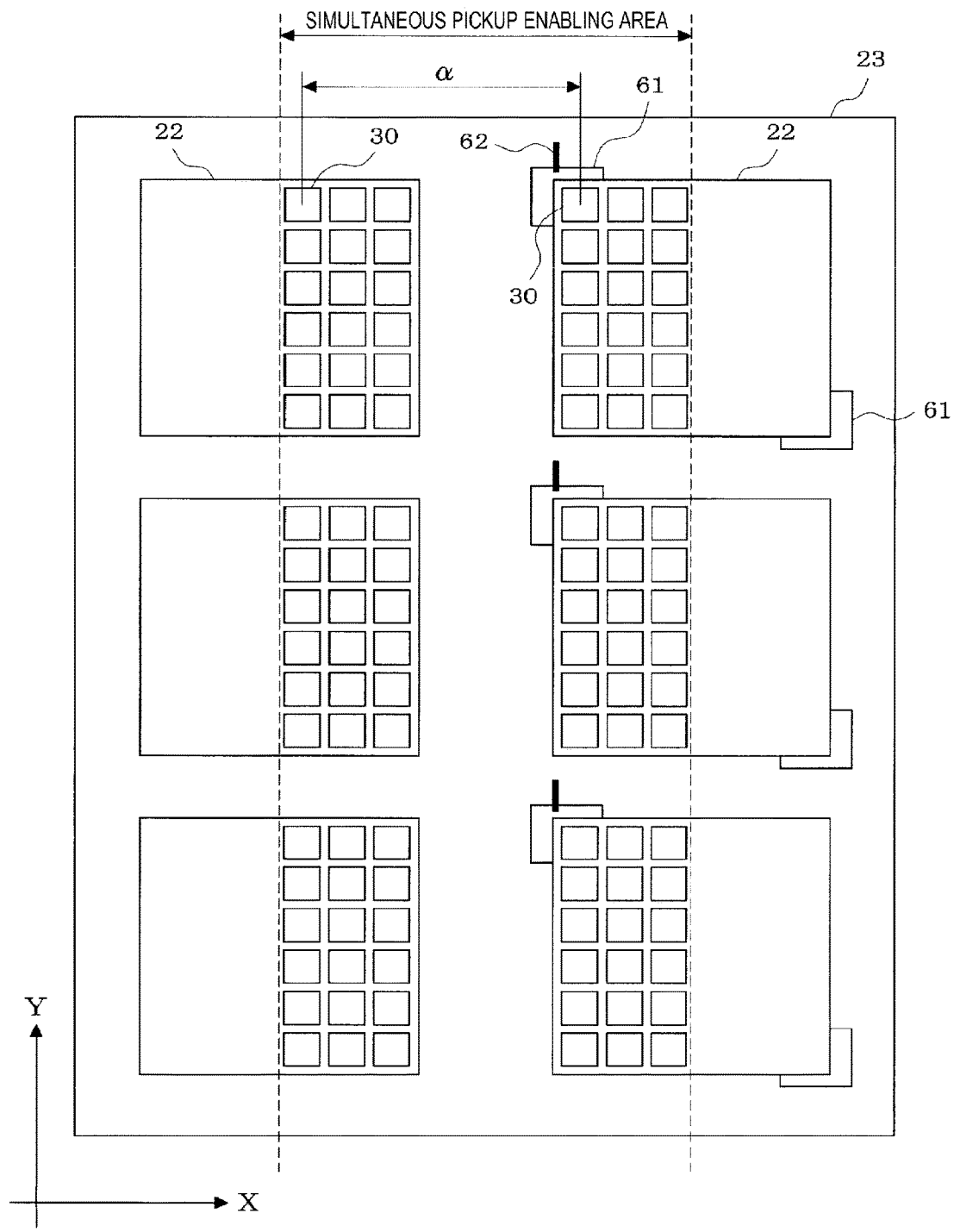
FIG. 6 is a plan view showing a state in which the trays on the pallet shown in FIG. 5 are rotated reversely thorough 180° so as to so change their directions.
Figure 7:
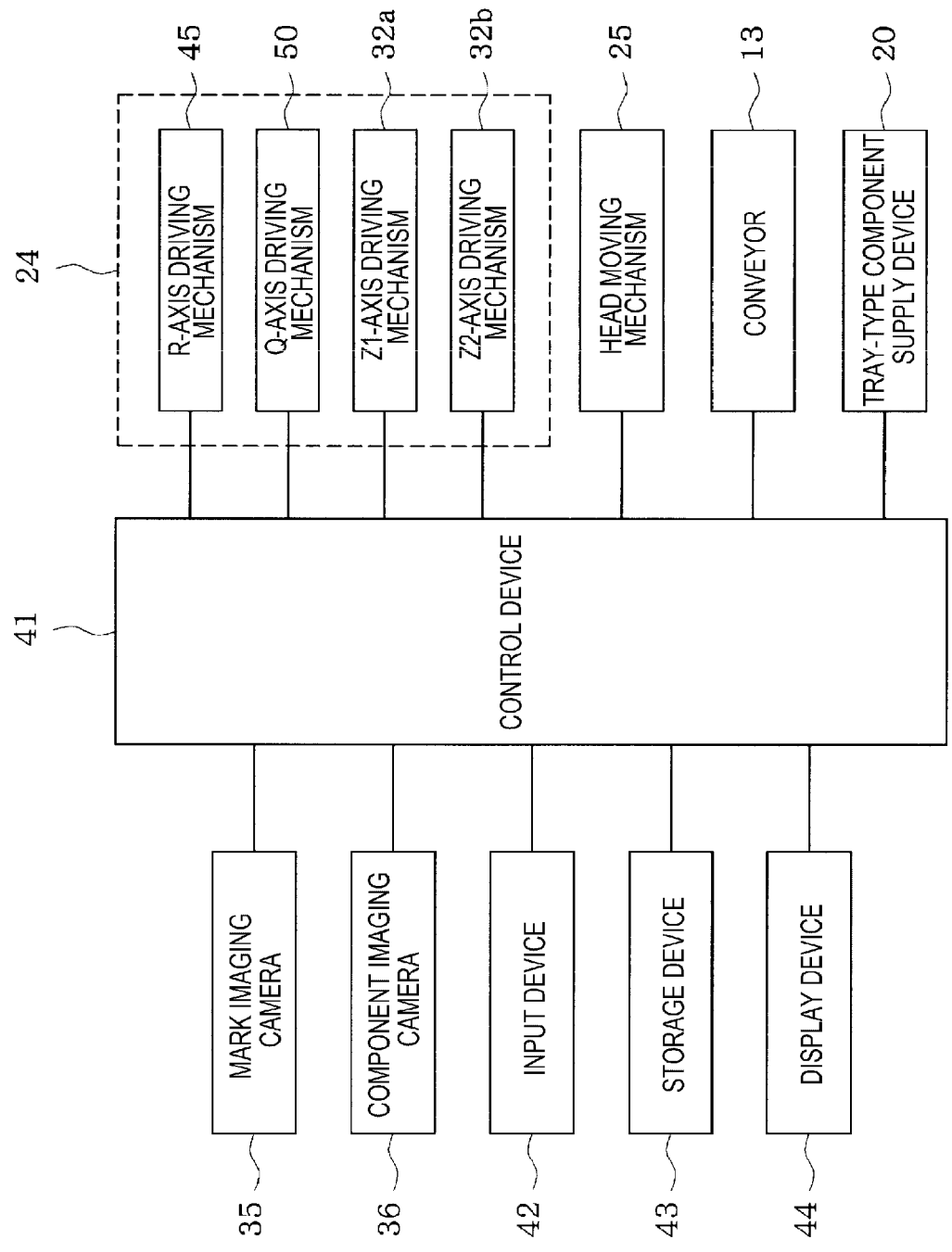
FIG. 7 is a block diagram showing the configuration of a control system of the component mounter.

In the present embodiment, as shown in FIGS. 4 to 6, magnet 61 is provided in, for example, each of two diagonal corner portions of each tray placement area where to place tray 22 on an upper surface of pallet 23 as a means for holding tray 22 so placed without any positional deviation. A magnetic material portion (not shown) such as an iron plate or the like is provided at least in a position corresponding to magnet 61 on a lower surface of each tray 22, so that tray 22 is held in place on pallet 23 by securely attracting the magnetic material portion on the lower surface of tray 22 by means of a magnetic attraction force of magnet 61 on pallet 23. In this case, when the position of tray 22 is shifted in accordance with interval α between two suction nozzles 26 that are lowered simultaneously, tray 22 is then held in place in the shifted position by means of the magnetic attraction force of magnet 61.

Although magnets 61 may be provided on all the tray placement areas on pallet 23, magnets 61 may be provided only on one of the two tray placement areas on which two suction nozzles 26, which are lowered simultaneously, are individually located. The positions of magnets 61 on each tray placement area are also not limited to the two diagonal corner portions, and hence, magnets 61 may be provided in four corner portions of the tray placement area. In addition, a magnet may be provided on a lower face of tray 22, while a magnetic material portion such as an iron plate or the like may be provided on the tray placement area of pallet 23.

Further, interval display section 62 is provided on pallet 23 so as to have a guide to interval α measured by an operator in performing a position adjusting operation of adjusting the position of at least one of two adjacent trays 22 in accordance with interval α defined between two suction nozzles 26 that are lowered simultaneously. In a case that mounting heads 24 are made to be exchangeable, when mounting heads 24 are exchanged, there is a possibility that interval α defined between two suction nozzles 26 that are lowered simultaneously is changed. Then, interval display section 62 may be made to display multiple intervals α in association with multiple types of exchangeable mounting heads 24. In place of interval display section 62, the operator may visually measure interval α using a measurement jig such as a scale or the like.

On the other hand, there are provided on component mounter 10 mark imaging camera 35 (refer to FIG. 7) configured to move together with mounting head 24 to image a reference position mark on circuit board 12 from thereabove and component imaging camera 36 (refer to FIG. 7) configured to image a component picked up by and held to suction nozzle 26 from therebelow.

Control device 41 of component mounter 10 has one or multiple computers (CPUs) and peripheral devices thereof, and connected thereto are input device 42 such as a keyboard, a mouse, a touch panel and the like, storage device 43 such as HDD, SSD, ROM, RAM and the like for storing various types of control programs such as a simultaneous pickup operation control program shown in FIGS. 8 to 10, which will be described later, data, and the like, display device 44 such as a liquid crystal display, CRT or the like, and the like.

In addition, control device 41 of component mounter 10 not only controls functional operations of component mounter 10 but also functions as an image processing device for imaging electronic component 30 on tray 22 using mark imaging camera 35, recognizing the position of electronic component 30 by processing the image of electronic component 30 so obtained, and controlling the positions of suction nozzles 26 that are lowered simultaneously based on the results of the recognition so made. As this occurs, control device 41 causes head moving mechanism 25 to move mounting head 24 so that two suction nozzles 26, which are lowered simultaneously, are located individually on two adjacent trays 22 on pallet 23, causes Z1-axis and Z2-axis driving mechanisms 32a, 32b to lower two suction nozzles 26 simultaneously, and causes two suction nozzles 26 so lowered to simultaneously pick up electronic components 30 on those two adjacent trays 22.

In this case, since the number of suction nozzles 26 provided on mounting head 24 is an integral multiple of the number of suction nozzles 26 that are lowered simultaneously (two in the present embodiment), control device 41 of component mounter 10 executes a simultaneous pickup operation on two adjacent trays 22 a number of times corresponding to the integral multiple in a pickup operation step of electronic components 30 to cause all of suction nozzles 26 on mounting head 24 to pick up electronic component 30, while in a step of mounting electronic components 30 so picked up on circuit board 12, control device 41 causes suction nozzles 26 to be lowered one by one so as to mount electronic components 30 held thereto on circuit board 12 one by one.

Further, as shown in FIG. 4, in a case that an interval at which electronic components 30 at the beginning on two adjacent trays 22 are spaced apart coincides with interval α defined between two suction nozzles 26 that are lowered simultaneously, enabling electronic components 30 at the beginning on those two adjacent trays 22 to be picked up simultaneously, control device 41 of component mounter 10 starts picking up electronic components 30 sequentially from those electronic components 30 at the beginning on those two adjacent trays 22. In this case, all areas of those two adjacent trays 22 constitute areas where a simultaneous pickup is enabled, whereby all electronic components 30 on those two adjacent trays 22 can be picked up simultaneously. Here, the position of the beginning of tray 22 takes the position of any one corner portion in four corner portions of tray 22. In the example shown in FIG. 4, the position of a left upper corner portion of each tray 22 constitutes the position of a beginning thereof, and electronic components 30 on two adjacent trays 22 are sequentially picked up simultaneously from electronic components 30 located at the beginning of two adjacent trays 22 in a vertical direction (or in a lateral direction) two at a time, and when all electronic components 30 in first columns (rows) on those two adjacent trays 22 have been picked up completely, electronic components 30 on second columns (rows) are then picked up sequentially two at a time, this simultaneous pickup operations being repeated from then on. As this occurs, when the pickup order of electronic components 30 (the movement direction of mounting head 24) is reversed for each column (row), electronic components 30 on each tray 22 can be picked up simultaneously with good efficiency while mounting head 24 only needs to move over its shortest moving distance.

In addition, in a case that electronic component 30 located at the beginning on first tray 22 of two adjacent trays 22 cannot be picked up simultaneously together with electronic component 30 located at the beginning on second tray 22 as shown in FIG. 5, control device 41 of component mounter 10 causes electronic components 30 on first and second trays 22 that fall within a simultaneous pickup enabling area to be simultaneously picked up in sequence from electronic components 30 located at the beginning on first and second trays 22 within the area in question, informs visually or audibly an operator that the directions of those two adjacent trays 22 are to be rotated reversely by 180° at a point in time when all electronic components 30 on first and second trays 22 that fall within the simultaneous pickup enabling area have simultaneously been picked up completely, and causes electronic components 30 remaining on those two adjacent trays 22 to be simultaneously picked up in sequence after the operator rotates reversely the direction of those two adjacent trays 22 by 180° as shown in FIG. 6.

It should be noted that, depending on the size of tray 22 and the size of electronic component 30, all of electronic components 30 on each tray 22 on pallet 23 cannot always be sucked simultaneously, and hence there may be a case in which electronic components 30 remain which cannot be picked up simultaneously. Then, control device 41 of component mounter 10 causes electronic components 30 on two adjacent trays 22 on pallet 23 that are positioned within the simultaneous pickup enabling area to be simultaneously picked up, while control device 41 causes electronic components 30 on those two adjacent trays 22 that are positioned out of the simultaneous pickup enabling area to be picked up one by one.

Figure 8:
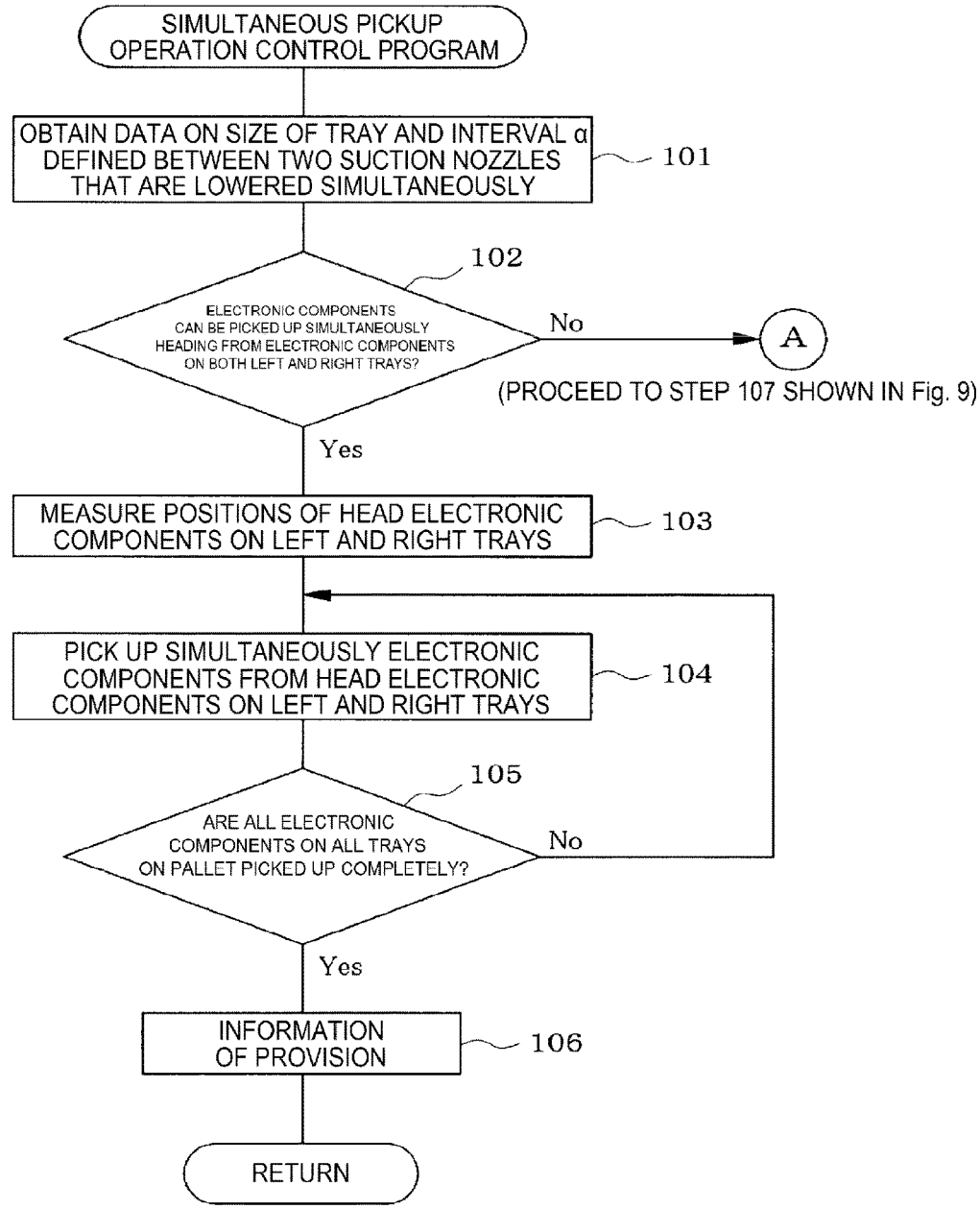
FIG. 8 is a flowchart (Part 1) showing a flow of processing of a simultaneous pickup operation control program.
Figure 9:
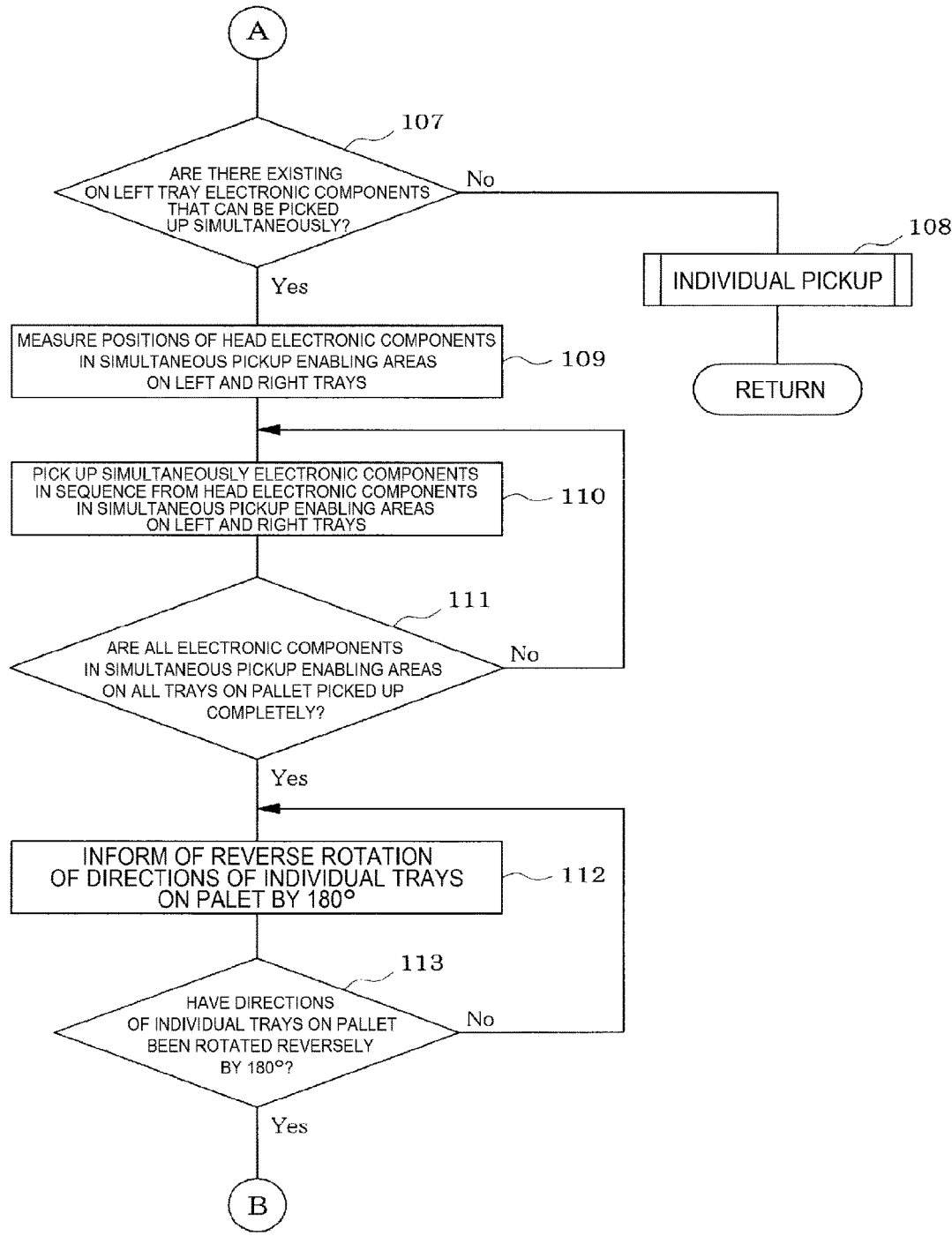
FIG. 9 is a flowchart (Part 2) showing a flow of processing of the simultaneous pickup operation control program.
Figure 10:
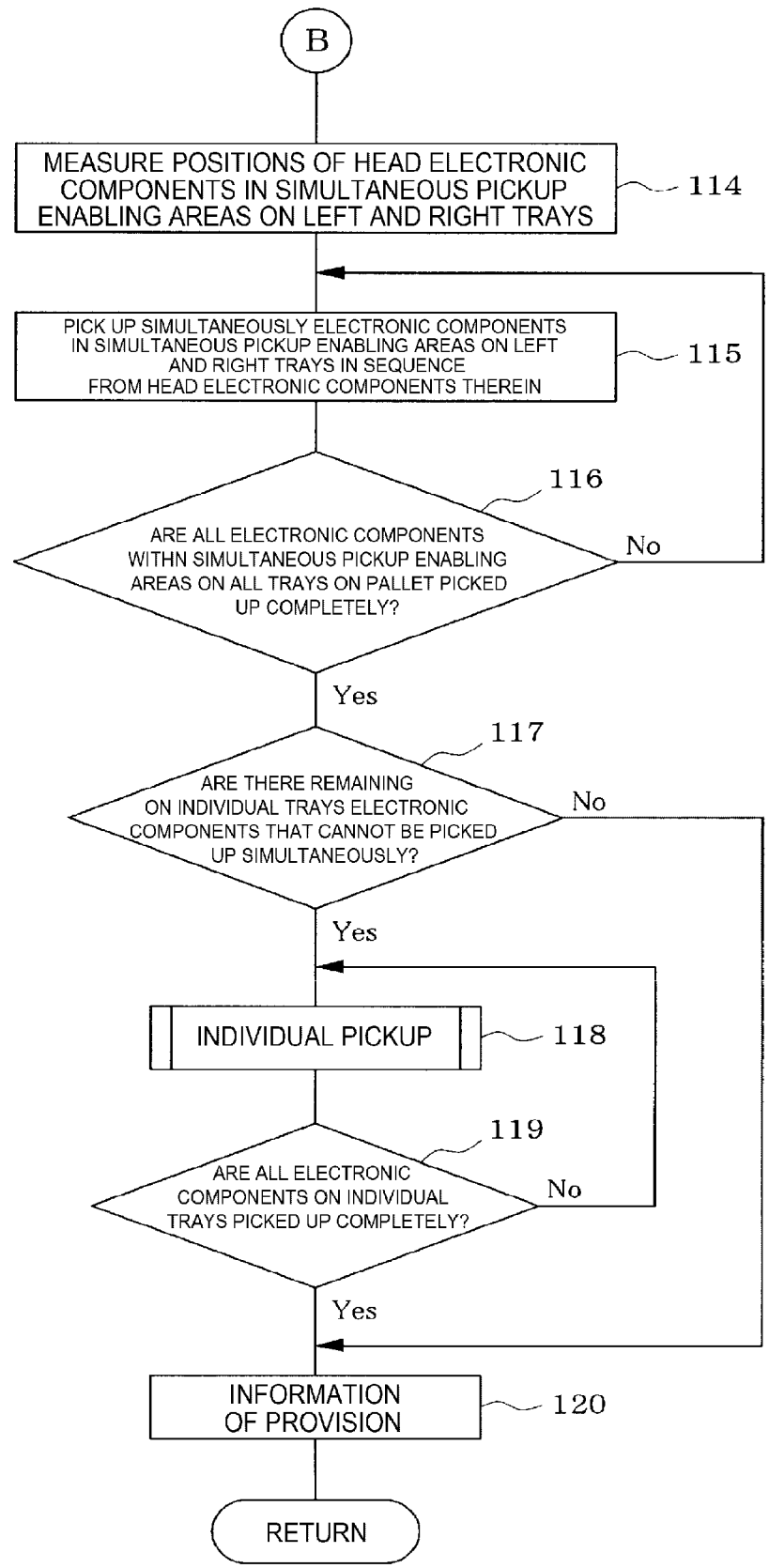
FIG. 10 is a flowchart (No. 3) showing a flow of processing of the simultaneous pickup operation control program.

The simultaneous pickup operation of electronic components 30 located on those two adjacent trays 22 described above is controlled by control device 41 of component mounter 10 in accordance with a simultaneous pickup operation control program shown in FIGS. 8 to 10. Hereinafter, processing details of the simultaneous pickup operation control program shown in FIGS. 8 to 10 will be described.

The simultaneous pickup operation control program shown in FIGS. 8 to 10 is a control example for a case in which two columns of trays 22 are arranged left and right on pallet 23 and two suction nozzles 26 that are lowered simultaneously are positioned in a left-right direction (an X-direction), as shown in FIGS. 4 to 6. The present program is activated every time pallet 23 on pallet pull-out table 27 of tray-type component supply device 20 is exchanged with pallet 23 that is newly provided or every time mounting heads 24 are exchanged.

When the present program is activated, first, in step 101, data is obtained on the size of trays 22 on pallet 23 and interval α defined between two suction nozzles 26 that are lowered simultaneously. Here, a method of obtaining the size of tray 22 may be, for example, such that tray 22 is imaged with mark imaging camera 35 and the size of tray 22 is measured by processing the image of tray 22 so captured. Alternatively, another size obtaining method may be adopted in which information on the size of tray 22 is recorded in a free space on tray 22 in question in the form of a barcode, a two-dimensional code or the like, the bar code, the two-dimensional code or the like so provided on tray 22 is imaged using mark imaging camera 35, and the image so captured is subjected to image processing to read out the size of tray 22 in question. Alternatively, a further size obtaining method may be adopted in which a tray ID, which is identification information of tray 22, is recorded in a free space of tray 22 in question in the form of a barcode, a two-dimensional code or the like, data on sizes of trays 22 for use for production are registered in a production management server or the like in association with tray IDs, the barcode, the two-dimensional code or the like recorded in tray 22 in question is imaged using mark imaging camera 35, the recorded tray ID is read out by processing the image captured, and the data on the size of tray 22 corresponding to the tray ID is obtained from the production management server or the like.

In addition, data on interval α defined between two suction nozzles 26 that are simultaneously lowered can be obtained from the production management server or the like. In a case that mounting heads 24 are exchangeable, a method may be adopted in which data on intervals α defined between two suction nozzles 26 that are lowered simultaneously are registered in association with head IDs which constitute identification information of mounting head 24 in the production management server or the like for each of multiple exchangeable mounting heads 24, and the data on interval α that corresponds to the head ID obtained at the time of an automatic exchange of mounting heads 24 is obtained from the production management server or the like.

Thereafter, the simultaneous pickup operation control program proceeds to step 102, where control device 41 of component mounter 10 determines whether left and right trays 22 are both such that electronic components 30 can be picked up simultaneously from electronic components 30 located at the beginning (that is, whether the interval defined between electronic components 30 located at the beginning of left and right trays 22 coincides with interval α defined between two suction nozzles 26) based on interval α defined between two suction nozzles 26 that are lowered simultaneously and the size of tray 22. As a result, if control device 41 determines that left and right arrays 22 are both such that electronic components 30 can be picked up simultaneously from electronic components 30 located at the beginning thereof, the simultaneous pickup operation control program proceeds to step 103, where electronic components 30 located at the beginning of those left and right trays 22 are imaged using mark imaging camera 35, and positions (XY-coordinates) of electronic components 30 located at the beginning of those left and right trays 22 are measured by processing the images thereof so captured. Thereafter, the simultaneous pickup operation control program proceeds to step 104, where electronic components 30 of those left and right trays 22 are simultaneously picked up in sequence from electronic components 30 located at the beginning thereof.

As this occurs, a configuration may be adopted in which every time electronic components 30 are picked up simultaneously, positions of subsequent electronic components 30 that will be picked up simultaneously are measured through image processing. Alternatively, a configuration may be adopted in which data on component arrangement pitches of electronic components 30 on tray 22 in the X-direction and the Y-direction are obtained from a recording section of component information of tray 22, the production management server or the like so as to calculate positions of subsequent electronic components 30 that will be picked up simultaneously based on the component arrangement pitches so obtained. Every time all of electronic components 30 on two left and right trays 22 are picked up completely, the simultaneous pickup of electronic components 30 is shifted to two left and right trays 22 on a subsequent adjacent row.

Thereafter, at a point in time when it is determined in step 105 that all electronic components 30 on all trays 22 on pallet 23 are picked up completely, the simultaneous pickup operation control program proceeds to step 106, where the operator is visually or audibly guided to provision of new pallet 23 so that current existing pallet 23 is exchanged for new pallet 23 that will be so provided.

On the other hand, if it is determined negatively or as "No" in step 102 before, that is, if first or left tray 22 is such that electronic components 30 cannot be picked up simultaneously from electronic component 30 located at the beginning thereof, the simultaneous pickup operation control program proceeds to step 107 shown in FIG. 9, where control device 41 determines whether there exist electronic components 30 on left tray 22 which can be picked up simultaneously. As a result, if control device 40 determines that there exist no electronic component 30 on left tray 22 which can be picked up simultaneously, the simultaneous pickup operation control program proceeds to step 108, where control device 41 causes electronic components 30 on both trays 22 to be picked up one by one (individual pickup).

If control device 41 determines in step 107 that there exist electronic components 30 on left tray 22, and they can be picked up simultaneously, the simultaneous pickup operation control program proceeds to step 109 where positions of electronic components 30 located at the beginning on left and right trays 22 which fall within a simultaneous pickup enabling area are measured through image processing. In the example shown in FIG. 5, a simultaneous pickup enabling area on left tray 22 constitutes a right half-area of left tray 22, and electronic component 30 located at the beginning in the simultaneous pickup enabling area on left tray 22 constitutes first electronic component 30 at a left end in the right half-area of left tray 22. A simultaneous pickup enabling area on right tray 22 constitutes a left half-area on right tray 22, and electronic component 30 located at the beginning in the simultaneous pickup enabling area on right tray 22 constitutes first electronic component 30 at a left end in right tray 22. It should be noted that depending on interval α defined between two suction nozzles 26 that are lowered simultaneously, there may be a case in which the simultaneous pickup enabling areas on left and right trays 22 are greater or smaller than a half of each tray 22.

Thereafter, the simultaneous pickup operation control program proceeds to step 110, where electronic components 30 in the simultaneous pickup enabling areas on left and right trays 22 are simultaneously picked up in sequence from electronic components 30 located at the beginning thereof. Every time all electronic components 30 in the simultaneous pickup enabling areas of two left and right trays 22 are picked up completely, the simultaneous pickup operation control program shifts to a simultaneous pickup of electronic components 30 in simultaneous pickup enabling areas on two left and right trays 22 in a subsequent adjacent row.

Thereafter, the simultaneous pickup operation control program proceeds to step 112, at a point in time when control device 41 determines in step S111 that all electronic components 30 in the simultaneous pickup enabling areas on all trays 22 on pallet 23 are picked up completely, and the operator is visually or audibly informed that the directions of all trays 22 on pallet 23 need to be rotated reversely by 180° in step 112.

Then, the simultaneous pickup operation control program waits to proceed until the directions of trays 22 on pallet 23 are rotated reversely by 180° in step 113. Thereafter, the simultaneous pickup operation control program proceeds to step 114 at a point in time when the directions of trays 22 on pallet 23 have been rotated reversely by 180°, where positions of electronic components 30 located at the beginning in the simultaneous pickup enabling areas on left and right trays 22 are measured through image processing.

Thereafter, the simultaneous pickup operation control program proceeds to step 115, where electronic components 30 in the simultaneous pickup enabling areas on left and right trays 22 are simultaneously picked up in sequence from electronic components 30 located at the beginning thereof. Every time all electronic components 30 in the simultaneous pickup enabling areas of two left and right trays 22 are picked up completely, the simultaneous pickup operation control program shifts to a simultaneous pickup of electronic components 30 in simultaneous pickup enabling areas on two left and right trays 22 in a subsequent adjacent row.

Thereafter, the simultaneous pickup operation control program proceeds to step 117 at a point in time when control device 41 determines in step S116 that all electronic components 30 in the simultaneous pickup enabling areas on all trays 22 on pallet 23 are picked up completely, and in step 117, control device 41 determines whether there remain on individual trays 22 on pallet 23 electronic components 30 that cannot be picked up simultaneously. In the example shown in FIGS. 5, 6, all electronic components 30 on individual trays 22 can be picked up simultaneously; however, there may be a case in which the simultaneous pickup enabling areas on left and right trays 22 are smaller than a half of each tray 22 when interval α defined between two suction nozzles 26 that are lowered simultaneously is narrow. In this case, even though the directions of individual trays 22 on pallet 23 are rotated reversely by 180°, there remain on individual trays 22 electronic components 30 that cannot be picked up simultaneously.

If control device 41 determines in step 117 that there remain on individual trays 22 on pallet 23 no electronic components 30 that cannot be picked up simultaneously, the simultaneous pickup operation control program proceeds to step 120, where control device 41 causes a provision guidance to be outputted visually or audibly so that existing pallet 23 can be exchanged for new pallet 23.

On the other hand, if control device 41 determines in step 117 that there remain on individual trays 22 on pallet 23 electronic components 30 that cannot be picked up simultaneously, the simultaneous pickup operation control program proceeds to step 118, where control device 41 causes electronic components 30 remaining on individual trays 22 on pallet 23 to be picked up one by one (individual pickup).

Thereafter, the simultaneous pickup operation control program proceeds to step 120 at a point in time when control device 41 determines in step 119 that all electronic components 30 on individual trays 22 on pallet 23 are picked up completely, where control device 41 causes a provision guidance to be outputted visually or audibly so that existing pallet 23 can be exchanged for new pallet 23.

As has been described before, in a case that multiple trays 22 are placed on pallet 23, the size of one tray 22 is smaller than a case in which one tray is placed on pallet 23, and the size of electronic components 30 that are arranged on tray 22 is smaller accordingly; however, interval α defined between two suction nozzles 26 that are lowered simultaneously remains constant even though the sizes of tray 22 and electronic component 30 are smaller. Then, in the present embodiment, since electronic components 30 on two trays 22 are made to be picked up simultaneously by moving mounting head 24 so that two suction nozzles 26 that are lowered simultaneously are located individually on two trays 22 on pallet 23, electronic components 30 on multiple trays 22 on pallet 23 can be picked up with good efficiency, thereby making it possible to improve the production cycle.

In the embodiment that has been described heretofore, while two suction nozzles 26 of mounting head 24 are described as being lowered simultaneously, a configuration may be adopted in which the Z-axis driving mechanism is provided at three or more locations on the circumference of mounting head 24 so that three or more suction nozzles 26 can be lowered simultaneously, whereby three or more electronic components 30 are picked up simultaneously with those three or more suction nozzles 26.

In addition, the present description is not limited to the embodiment that has been described heretofore, whereby the present description can be carried by being modified or altered variously without departing from the spirit and scope of the present description, and hence, for example, the configuration of mounting head 24 may be modified, the processing of the simultaneous pickup operation control program shown in FIGS. 8 to 10 may be modified, or the like.

REFERENCE SIGNS LIST

10 . . . component mounter, 12 . . . circuit board, 20 . . . tray-type component supply device, 21 . . . magazine, 22 . . . tray, 23 . . . pallet, 24 . . . mounting head, 25 . . . head moving mechanism, 26 . . . suction nozzle, 27 . . . pallet pull-out table, 29 . . . rotary head section, 30 . . . electronic component, 32a . . . Z1-axis driving mechanism, 32b . . . Z2-axis driving mechanism, 41 . . . control device, 61 . . . magnet, 62 . . . interval display section

The invention claimed is:

1. A component mounter for mounting electronic components, comprising:
    a mounting head including multiple suction nozzles configured to pick up and mount the electronic components on a circuit board, at least two suction nozzles of the multiple suction nozzles are lowered simultaneously so as to pick up at least two electronic components simultaneously;
    a pallet configured to hold multiple trays, the trays configured to hold the electronic components; and
    a control device configured to perform an electronic component pickup operation step that includes moving the mounting head to a position,
        lowering simultaneously the at least two suction nozzles to be located individually on at least two trays on the pallet, and
        picking up the electronic components simultaneously on the at least two trays.

2. The component mounter according to claim 1, wherein the control device obtains information on an interval defined between the at least two suction nozzles that are lowered simultaneously and a size of the at least two trays on the pallet to thereby determine positions of the electronic components that are to be picked up simultaneously.

3. The component mounter according to claim 1, wherein the mounting head comprises a mark imaging camera configured to image a reference mark on the circuit board, and
wherein the control device causes the electronic components that are to be simultaneously picked up to be imaged with the mark imaging camera, recognizes positions of the electronic components that are to be simultaneously picked up by processing an image so captured of the electronic components that are to be simultaneously picked up, and controls positions of the at least two suction nozzles that are simultaneously lowered based on a result of the positions.

4. The component mounter according to claim 1, wherein a number of the multiple suction nozzles provided on the mounting head is an integral multiple of a number of the suction nozzles that are simultaneously lowered, and
wherein in the electronic component pickup operation step, the control device executes a simultaneous pickup operation deployed on the at least two trays a number of times corresponding to the integral multiple to pick up the electronic components with the multiple suction nozzles, while in a step of mounting the electronic components so picked up on the circuit board, the control device causes the multiple suction nozzles to be lowered one by one to mount the electronic components so picked up on the circuit board one by one.

5. The component mounter according to claim 1, wherein a number of the suction nozzles that are simultaneously lowered is two, and
wherein the pallet is made capable of adjusting a position of at least one tray of two adjacent trays so that an interval defined between two electronic components that are individually located on the two adjacent trays to be picked up simultaneously matches an interval defined between the two suction nozzles that are simultaneously lowered.

6. The component mounter according to claim 5, wherein the pallet comprises an interval display section including a guide to measurement by an operator of the interval defined between the two suction nozzles that are simultaneously lowered in performing an operation of adjusting the position of the at least one tray of the two adjacent trays so as to match the interval.

7. The component mounter according to claim 5, wherein when beginning electronic components located at beginning of each of the two adjacent trays can simultaneously be picked up, the control device causes the beginning electronic components to simultaneously be picked up in sequence from the electronic components located at the beginning of each of the two adjacent trays.

8. The component mounter according to claim 5,
wherein when a beginning electronic component located at a beginning of one tray of the two adjacent trays cannot simultaneously be picked up, the control device causes the electronic components on the two adjacent trays that fall within a simultaneous pickup enabling area to simultaneously be picked up in sequence from the electronic components located at the beginning of the simultaneous pickup enabling area therein, informs an operator that directions of the two adjacent trays are to be rotated reversely by 180° at a point in time when all the electronic components in the simultaneous pickup enabling area are simultaneously picked up completely, and causes the electronic components remaining on the two adjacent trays to simultaneously be picked up in sequence after the operator has rotated the trays reversely by 180°.

9. The component mounter according to claim 1,
wherein the control device causes the electronic components on the at least two trays on the pallet that are positioned within a simultaneous pickup enabling area to simultaneously be picked up and causes the electronic components positioned out of the simultaneous pickup enabling area to be picked up one by one.

\* \* \* \* \*